US006747820B2

(12) United States Patent
Zbinden et al.

(10) Patent No.: US 6,747,820 B2
(45) Date of Patent: Jun. 8, 2004

(54) COOLING OPTO-ELECTRONIC PACKAGES

(75) Inventors: Eric J. Zbinden, Mountain View, CA (US); Tom Mader, San Jose, CA (US); Jan Peeters Weem, Newark, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/278,401

(22) Filed: Oct. 23, 2002

(65) Prior Publication Data

US 2004/0080838 A1 Apr. 29, 2004

(51) Int. Cl.[7] .............................. G02B 7/02; G02B 6/12; G02B 6/36; G02B 6/42; G02B 6/00
(52) U.S. Cl. .......................... 359/820; 385/14; 385/52; 385/92; 385/94; 385/134
(58) Field of Search ................................. 359/820, 248; 385/14, 52, 49, 92, 94, 88, 134, 136; 257/81, 98, 432

(56) References Cited

U.S. PATENT DOCUMENTS

| 6,088,501 A | * | 7/2000 | Delrosso ..................... 385/134 |
| 6,270,263 B1 | * | 8/2001 | Iwase et al. .................. 385/92 |
| 6,332,720 B1 | * | 12/2001 | Shimaoka et al. ............ 385/88 |
| 6,487,027 B2 | * | 11/2002 | Yamauchi et al. ........... 359/820 |
| 2001/0038498 A1 | * | 11/2001 | Furuhashi et al. .......... 359/819 |
| 2003/0026557 A1 | * | 2/2003 | Galeotti et al. ............... 385/94 |
| 2003/0095346 A1 | * | 5/2003 | Nasu et al. .................. 359/820 |

* cited by examiner

Primary Examiner—Loha Ben
(74) Attorney, Agent, or Firm—Trop, Pruner & Hu, P.C.

(57) ABSTRACT

An opto-electronic module may be provided with an internal thermoelectric cooler. Components to be cooled may be positioned over the thermoelectric cooler. Other components may be positioned aside the cooled components but raised, using a riser, to position them away from the cooled components.

24 Claims, 2 Drawing Sheets

COOLING OPTO-ELECTRONIC PACKAGES

BACKGROUND

This invention relates generally to packages for optical modules and, particularly, to packages that receive an optical fiber and provide electrical connections thereto.

Standard techniques to carry an electrical signal across the wall of a package for optical modules include multi-layer ceramic inserts. Standard ceramic packages for optical modules, commonly called butterfly packages, may include a base, a fiber feed-through, a can body, and a ring frame made of metal, as well as one or more multi-layer ceramic inserts that receive electrical connectors. A lid is typically used to hermetically close the package by welding or soldering to the ring frame.

Commonly one or more opto-electronic components in the packages need to be cooled down or maintained at a given temperature. This is usually done using thermoelectric coolers based on the Peltier effect.

The power needed by the thermoelectric cooler to maintain the package at the preset temperature is usually much greater than the original thermal load to dissipate. It is therefore important to reduce or minimize the thermal load on the thermoelectric cooler if it is desirable to minimize or reduce the power dissipated by the opto-electronic package.

In some cases not all of the opto-electronic components in the package need to be cooled down. But, generally, for performance reasons, the cooled and uncooled components need to be located very close to one another.

Thus, there is a need for better ways to cool packages for optical modules.

DETAILED DESCRIPTION

Figure 1:
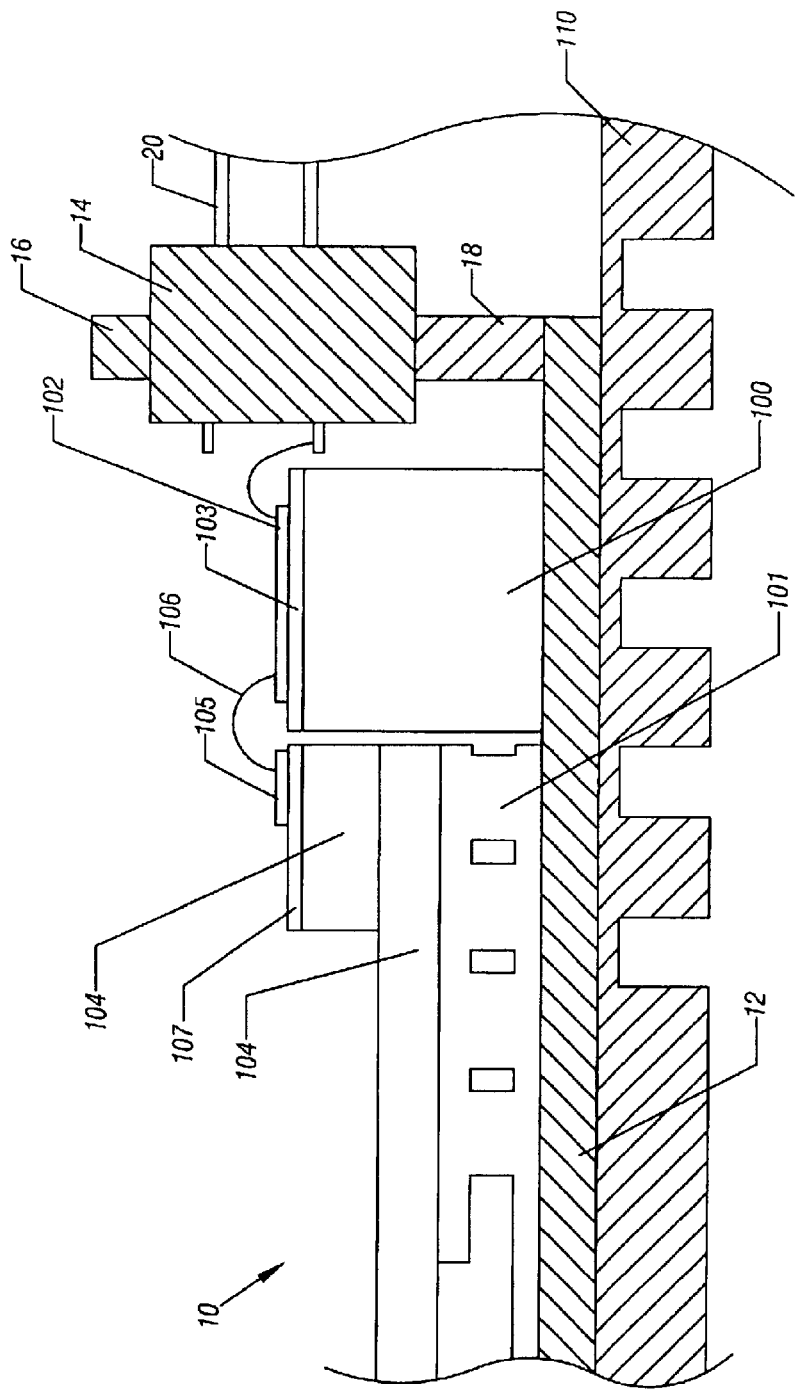
FIG. 1 is an enlarged cross-sectional view of one embodiment of the present invention.

Referring to FIG. 1, in one embodiment of the present invention, the optical package 10 for an optical module includes a base 12, a can body 18, and a ring frame 16 made of metal, as well as one or more ceramic inserts 14 that receive electrical connectors. A lid (not shown) may be used to hermetically close the package 10 by welding or soldering to the ring frame 16. Various electrical connections 20 may be made through the ceramic insert 14.

A heat sink or heat dissipating structure 110 may be secured to the base 12. A thermoelectric cooler 101 may be positioned within the package 10 on the base 12. Components, such as the component 102, that do not require temperature control may be mounted on a riser 100 which moves those components away from components that must be cooled and away from the thermoelectric cooler 101. The components 104 that need to be at a controlled temperature and/or cooled are mounted directly on or over the thermoelectric cooler 101 in one embodiment. The cooled and uncooled surfaces can be in the same or different planes.

Electrical connections between the uncooled submount 102 and the cooled submount 107 can be provided by flexible electrical connections 106. For example, the connection 106 may also be a wire bond, flexible circuit, or a single submount, as examples. An integrated circuit 102 may be mounted on the uncooled submount 103 and an integrated circuit 105 may be mounted on the cooled submount 107. The components 102 and 105 may be electrically connected by suitable connections 106.

Figure 2:
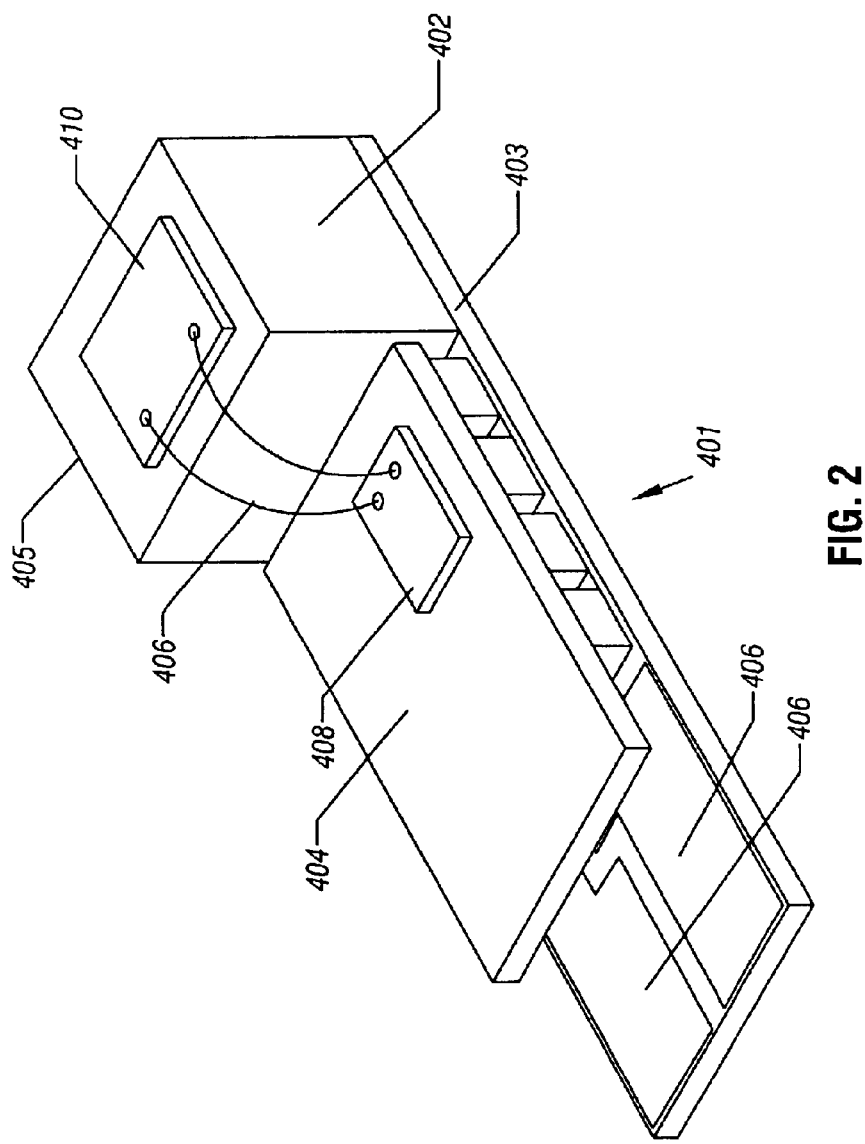
FIG. 2 is an enlarged perspective view of another embodiment of the present invention.

Referring to FIG. 2, in accordance with another embodiment of the present invention, a thermoelectric cooler 401 that may be mounted in an opto-electronic package (not shown) includes the riser 402, which corresponds to the riser 100 in FIG. 1. The riser 402 is integrated into the thermoelectric cooler 401 through the hot side 403.

The cooler 401 develops a cool top surface 404 and an uncooled top surface 405. The two surfaces 404 and 405 can be on the same plane or on different planes (as shown) to accommodate stack up height differences on the cooled and uncooled load.

A wire bond 406 may be utilized to connect the circuits 410 and 408. The thermoelectric cooler 401 may also include a wire bondable pad 406 for power connections, as well it could have electrical leads (not shown) for power connections.

Thus, in accordance with some embodiments of the present invention, heat from the uncooled side passes downwardly to the heat sink 110 on the right. Additional heat, generated by the components mounted on the cooled side, such as circuit 105 or 408, and by the thermoelectric cooler 101 itself, passes downwardly to the left. While the heat load is dissipated using a finned heat sink 110 in the embodiment shown in FIG. 1, other mechanisms may also be utilized to evacuate the heat load.

In accordance with some embodiments of the present invention, the thermal load on the thermoelectric cooler 101 or 401 may be reduced or minimized. Similarly, the thermoelectric cooler current to transfer the thermal load may be reduced or minimized. In some embodiments, the heat dissipation at the module level may be reduced or minimized. In some embodiments, the optical module manufacturing may be reduced or minimized by adding the passive thermal path to the butterfly can or the thermoelectric cooler. In some embodiments, the level of integration of the optical electronic components may be increased because a laser diode driver or other high powered, high speed, components may be integrated into the opto-electronic package. In addition, the opto-electronic package may provide electromagnetic shielding of the laser diode driver or other electronic components in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a package for an opto-electronic module;
   including a thermoelectric cooler in said package; and
   mounting elements to be cooled over said thermoelectric cooler and mounting elements not to be cooled on a riser adjacent said thermoelectric cooler.

2. The method of claim 1 including integrating said thermoelectic cooler and said riser.

3. The method of claim 1 including providing a heat sink attached to said package.

4. The method of claim 1 including spacing said elements to be cooled from said elements not to be cooled.

5. The method of claim 1 including positioning said elements to be cooled and said elements not to be cooled in approximately the same plane.

6. The method of claim 1 including positioning said elements to be cooled on a different plane from the elements not to be cooled.

7. The method of claim 1 including electrically connecting said elements to be cooled and said elements not to be cooled.

8. The method of claim 7 including electrically connecting said elements to be cooled and said elements not to be cooled by a flex circuit.

9. The method of claim 8 including electrically connecting said elements to be cooled and said elements not to be cooled using a wire bond.

10. A package for an opto-electronic module comprising:

a can body;

a thermoelectic cooler in said can body; and a riser positioned adjacent said thermoelectic cooler to define an uncooled surface on top of said riser.

11. The package of claim 10 including a component to be cooled positioned over said thermoelectric cooler.

12. The package of claim 11 wherein said component to be cooled is positioned directly on said thermoelectric cooler.

13. The package of claim 10 including a component on said uncooled surface of said riser, said component on said riser coupled to said component over said thermoelectric cooler.

14. The package of claim 13 wherein said component on said riser and said component over said cooler are coupled by an electrical connection.

15. The package of claim 14 wherein said electrical connection is a wirebond.

16. The package of claim 10 including a heat dissipating device coupled to said can body.

17. The package of claim 16 wherein said heat dissipating device includes a heat sink with fins.

18. The package of claim 10 wherein said riser is incorporated into said thermoelectric cooler.

19. The package of claim 10 including said riser positioned adjacent to, but spaced from, said thermoelectric cooler.

20. A thermoelectric cooler module comprising:

a thermoelectric cooler;

a cooled surface positioned over said thermoelectric cooler;

a riser adjacent said cooler; and an uncooled surface positioned on the riser adjacent said thermoelectric cooler.

21. The cooler module of claim 20 wherein said riser is spaced from said cooler.

22. The cooler module of claim 20 wherein said cooled and uncooled surfaces are on the same plane.

23. The cooler module of claim 20 wherein said cooled and uncooled surfaces are on different planes.

24. The cooler module of claim 20 including a support surface mounting said riser and said cooler, said support surface including bond pads for supplying power to said cooler.

* * * * *